United States Patent
Bedell et al.

(10) Patent No.: US 8,927,431 B2
(45) Date of Patent: Jan. 6, 2015

(54) HIGH-RATE CHEMICAL VAPOR ETCH OF SILICON SUBSTRATES

(71) Applicant: International Business Machines Corporation, Armonk, NY (US)

(72) Inventors: Stephen W. Bedell, Wappingers Falls, NY (US); Gen P. Lauer, Yorktown Heights, NY (US); Isaac Lauer, Yorktown Heights, NY (US); Joseph S. Newbury, Irvington, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/906,392

(22) Filed: May 31, 2013

(65) Prior Publication Data
US 2014/0357082 A1    Dec. 4, 2014

(51) Int. Cl.
*H01L 21/311* (2006.01)
*H01L 21/306* (2006.01)
*H01L 21/308* (2006.01)

(52) U.S. Cl.
CPC ........ *H01L 21/30604* (2013.01); *H01L 21/308* (2013.01)
USPC ................. 438/694; 216/37; 216/63; 216/79; 438/706

(58) Field of Classification Search
USPC ................................ 216/37, 79, 63; 438/694
See application file for complete search history.

(56) References Cited

U.S. PATENT DOCUMENTS

| 7,651,948 B2 | 1/2010 | Kim et al. |
| 7,776,679 B2 | 8/2010 | Loubet et al. |
| 8,278,176 B2 | 10/2012 | Bauer et al. |

OTHER PUBLICATIONS

Bauer et al., "Low temperature catalyst enhanced etch process with high etch rate selectivity for amorphous silicon based alloys over single-crystalline silicon based alloys",Thin Solid Films, vol. 520, Issue 8, Feb. 1, 2012, pp. 3139-3143.

Shinriki et al., "Gas phase particle formation and elimination on Si (100) in low temperature reduced pressure chemical vapor deposition silicon-based epitaxial layers", Thin Solid Films, vol. 520, Issue 8, Feb. 1, 2012, pp. 3190-3194.

*Primary Examiner* — Roberts Culbert
(74) *Attorney, Agent, or Firm* — L. Jeffrey Kelly; Louis J. Percello

(57) ABSTRACT

Methods of etching a silicon substrate at a high rate using a chemical vapor etching process are provided. A silicon substrate may be etched by heating the silicon substrate in a process chamber and then flowing hydrochloric acid and a germanium-carrying compound into the process chamber. The substrate may be heated to at least 700° C. The hydrochloric acid flow rate may be at least approximately 100 (standard cubic centimeters per minute) sccm. In some embodiments, the hydrochloric acid flow rate may be between approximately 10 slm and approximately 20 standard liters per minute (slm). The germanium-carrying compound flow rate may be at least approximately 50 sccm. In some embodiments, the germanium-carrying compound flow rate may be between approximately 100 sccm and approximately 500 sccm. The etching may extend fully through the silicon substrate.

20 Claims, 2 Drawing Sheets

HIGH-RATE CHEMICAL VAPOR ETCH OF SILICON SUBSTRATES

BACKGROUND

The present invention generally relates to etching silicon substrates, and particularly to a high-rate silicon chemical vapor etching process.

Semiconductor fabrication frequently utilizes various etching processes to form large features in silicon substrates. In some processes, these features include holes etched through the entirety of the silicon substrate. Exemplary features that do not etch fully through the substrate may include deep trench isolation and deep trench capacitors. Exemplary features that do etch fully through the substrate may include through-substrate vias (TSV). Etching large features in a silicon substrate may also be useful in the formation of devices containing DNA-sequencing nanopores.

However, silicon substrates may have thicknesses many times greater than the etch rate of typical etching processes, resulting in very long etch times to form the various features in the silicon substrate. Longer etch times may increase the overall fabrication time and therefore increase cost, decrease yield, or both. A method of increasing the etch rate of a silicon substrate may therefore be desirable.

BRIEF SUMMARY

The one or more embodiments of the present invention relate to a high-rate chemical vapor etch process for silicon substrates. Embodiments include heating a silicon substrate to a desired temperature of at least approximately 700° C. in a process chamber and flowing hydrochloric acid and a germanium-carrying compound into the process chamber. The hydrochloric acid flow rate may be at least approximately 100 standard cubic centimeters per minute (sccm) and the germanium-carrying compound flow rate may be at least approximately 50 sccm. In some embodiments, the temperature may range from approximately 800° C. to approximately 1000° C., the hydrochloric acid flow rate may range from approximately 10 standard liters per minute (slm) to approximately 20 slm, and the germanium-carrying compound flow rate may range from approximately 100 sccm to approximately 500 sccm.

In some embodiments, a masking layer may be formed above the silicon substrate and a mask opening formed in the masking layer prior to heating. The etching process may result in an opening being formed in the silicon substrate below the mask opening. The opening in the silicon may have a depth of less than the thickness of the silicon substrate, or it may extend fully through the silicon substrate.

BRIEF DESCRIPTION OF THE SEVERAL VIEWS OF THE DRAWINGS

The following detailed description, given by way of example and not intend to limit the invention solely thereto, will best be appreciated in conjunction with the accompanying drawings, in which.

Figure 1C:
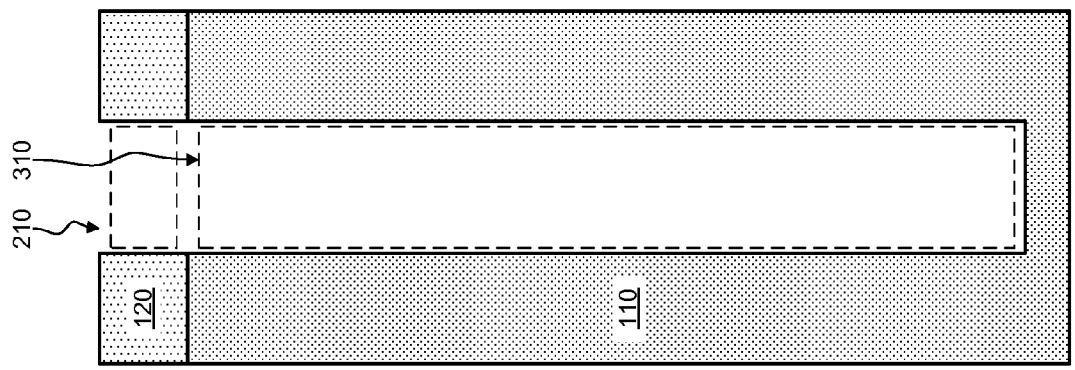
FIG. 1C is a cross-sectional view depicting etching the semiconductor substrate, according to an embodiment of the present invention.

Elements of the figures are not necessarily to scale and are not intended to portray specific parameters of the invention. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments will now be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Embodiments of the invention generally relate to methods of etching structures (e.g. holes, trenches, etc) into a silicon substrate. Such structures may be incorporated into larger microelectronic structures such as through-substrate vias and devices including DNA-sequencing nanopores. Because embodiments of the invention may be capable of etching silicon substrates much faster than typical methods, fabrication processes incorporating embodiments of the invention may be completed in less time, potentially reducing cost.

Figure 1B:
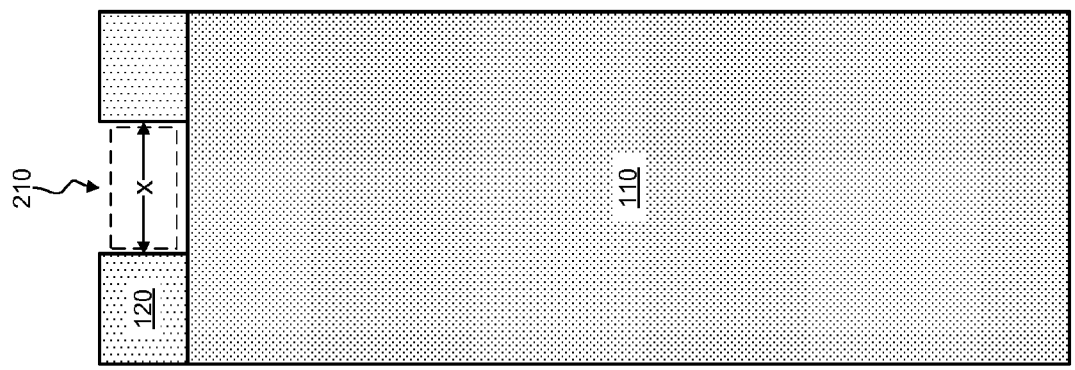
FIG. 1B is a cross-sectional view depicting forming an opening in the hard mask layer, according to an embodiment of the present invention.
Figure 1A:
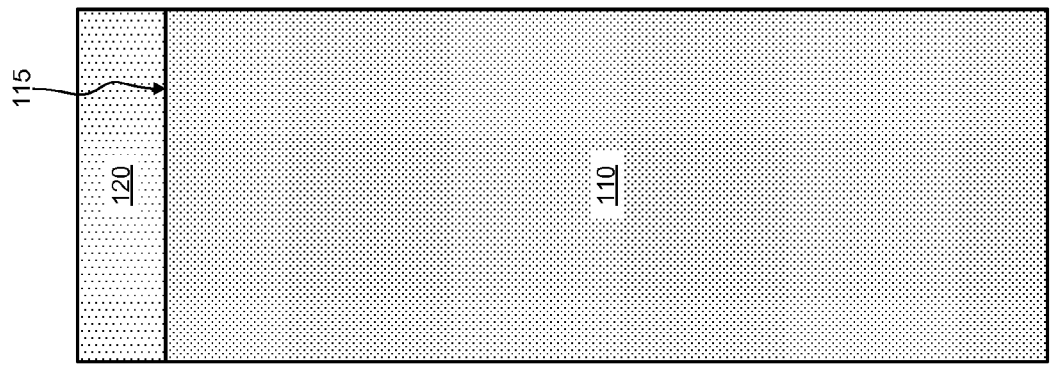
FIG. 1A is a cross-sectional view depicting a silicon substrate and a hard mask layer, according to an embodiment of the present invention.

Referring to FIG. 1A, a semiconductor structure 100 including a crystalline silicon substrate 110 and a mask layer 120 may be provided or formed using typical methods known to one of ordinary skill in the art. Typically, the silicon substrate 110 may be about, but is not limited to, several hundred microns thick. For example, the silicon substrate 110 may include a thickness ranging from 0.5 mm to about 1.5 mm. In some embodiments, the silicon substrate may contain other compounds, such as dopants or alloyed metals. In order to maximize the etch rate of the etching process described below, the top surface of the silicon substrate may have a <1,0,0> crystal orientation. The silicon substrate 110 may further include additional microelectronic structures within the silicon substrate 110 or on its surface, but these structures have been omitted from the figures for clarity.

With continued reference to FIG. 1A, the mask layer 120 may be made of typical masking materials, including photoresists, oxides, and nitrides, compatible with the etching conditions described below (e.g., capable of withstanding temperatures of at least 700° C.). The inclusion of a hard mask material such as silicon oxide or silicon nitride may increase the etch resistivity of the mask layer 120 and reduce the possibilty of unintentionally etching through the mask layer 120 during subsequent processes. The mask layer 120 may include one or more layers, with each layer made of the same or a different material as the other layers. Depending on the materials selected, the mask layer 120 may have a thickness of at least approximately 1 nm. In some embodiments, the mask layer 120 may have a thickness ranging from approximately 2 nm to approximately 1 μm.

Referring to FIG. 1B, a mask opening 210 may be formed in the mask layer 120 using any suitable means known in the art to expose a portion of the silicon substrate. For example, where the mask layer 120 is made of a photoresist material, the mask layer 120 may be exposed to light and then developed to remove the portion of the mask layer 120 in the mask opening 210. In other embodiments where the mask layer 120 includes an oxide or a nitride, the mask opening 210 may be formed by etching the mask layer 120 with typical etching techniques such as reactive ion etching (RIE) or plasma etching.

The mask opening 210 should have the same cross sectional area as the structure to be etched into the silicon substrate 110. In exemplary embodiment, the mask opening 210 may have a width x of at least approximately 1 μm. In some embodiments, x may range from approximately 100 μm to approximately 5 mm. However, greater and lesser widths are explicitly contemplated.

Referring to FIG. 1C, the silicon substrate 110 may be etched below the opening 210 to form a substrate opening 310. The substrate opening 310 may have the same cross-sectional area at the top of the substrate opening 310 as the mask opening 210. While substrate opening 310 depicted in FIG. 1C has substantially vertical sidewalls, other embodiments have sloped sidewalls, so that the cross-sectional area at the bottom of the substrate opening 310 may be smaller than the cross-sectional area at the top of the substrate opening 310. The substrate opening 310 may have a depth of up to the thickness of the silicon substrate 110. In some embodiments, such as those wherein forming the substrate opening is a step in the process of forming a through-substrate via (TSV) or a substrate nanopore, the substrate opening 310 may extend fully through the silicon substrate 110.

The silicon substrate 110 may be etched using a high-rate chemical vapor etching (CVE) process using gaseous hydrogen chloride (HCl) as an etchant and a germanium-carrying compound to greatly enhance the etch rate. Exemplary germanium carrying gases include germane ($GeH_4$), germanium tetrachloride ($GeCl_4$), and digermane ($Ge_2H_6$). In the embodiments described, below, $GeH_4$ is used to increase the etch rate. However, a person of ordinary skill in the art will understand how to adapt the process to utilize other germanium-carrying gases.

In one embodiment, the etching process may occur in a process chamber suitable for rapid thermal CVD. In other embodiments, a person of ordinary skill in the art will understand how to adapt an alternative process chamber or fabricate a custom chamber to heat the silicon substrate 110 to the desired temperatures while providing the desired gas flow rates. Generally, the process chamber may be any enclosure capable of containing the silicon substrate 110 while being etched under the conditions detailed below. Once loaded into the process chamber, the silicon substrate may be heated to the desired etch temperature. The minimum desired etch temperature may be approximately 700° C. In some embodiments, etch temperatures may range from approximately 800° C. to approximately 1000° C. In some embodiments, a carrier gas, such as hydrogen, may be flowed into the process chamber during heating.

Once the silicon substrate 110 has reached the desired etch temperature, any carrier gas may be shut off and HCl and $GeH_4$ gas may be flowed into the process chamber. HCl flow rates may be at least approximately 100 standard cubic centimeters per minute (sccm). In some embodiments, HCl flow rates may range from approximately 10 standard cubic liters per minute (slm) to approximately 20 slm. $GeH_4$ flow rates may be at least 50 sccm. In some embodiments, $GeH_4$ flow rates may range from approximately 100 sccm to approximately 500 sccm. The flow rates of other germanium-carrying compounds may be similar to that of $GeH_4$. During etching, the pressure within the process chamber may be at least approximately 10 torr. In some embodiments, the pressure may range from approximately 100 torr to approximately 700 torr.

HCl is capable of etching silicon by reacting with silicon according to the following formula: $2HCl(g)+Si(s) \rightarrow SiCl_2(g)+H_2(g)$. Because both the $SiCl_2$ and $H_2$ are gasses at process temperature and pressure, the result of the reaction is a net removal of material from the silicon substrate 110. By including germanium (e.g., from the $GeH_4$) in the etching gas, the etching reaction rate is increased by germanium diffusing into the silicon substrate 110. As the germanium increases the desorption of $SiCl_2$ and $H_2$ from the surface of c and diffuses into the silicon substrate 110, additional silicon atoms may be pushed to the surface of the silicon substrate 110 where they may be reacted with the HCl.

In some embodiments, once the substrate opening 310 has reached its desired depth, the $GeH_4$ gas flow rate may be reduced to zero and the etch allowed to proceed for a brief amount of time, approximately a few seconds, with only HCl to remove any excess germanium still on the exposed surfaces of the silicon substrate 110.

Under the conditions described above, the silicon substrate 110 may be etched at rates of at least approximately 10 μm/min, though lesser etch rates are explicitly contemplated. In some embodiments, etch rates of greater than 30 μm/min may also be achievable. The etch rate may be further increased by increasing the size of the mask opening 210.

Besides increased speed, embodiments of the present invention may also offer the advantage of being a dry etching process. Unlike many high etch-rate wet etch processes, embodiments of the present invention may avoid the potentially dangerous drying step typically required of wet etch processes. Further, the dry nature of embodiments of the present invention reduces the amount of protection that needs to be applied to the back side of the silicon substrate 110, further reducing the complexity of the etching process.

Figure 2C:
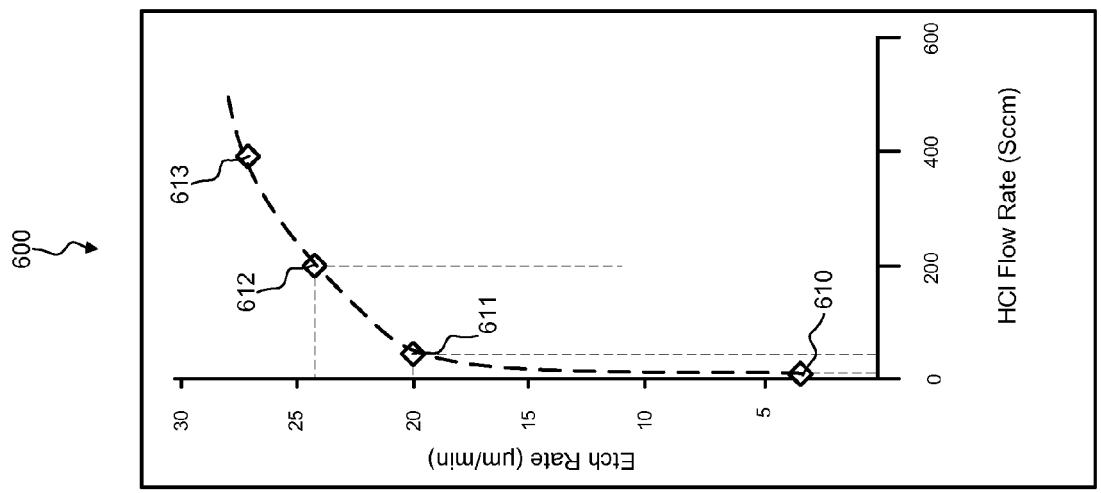
FIG. 2C is a graph depicting the etch rate at various etchant flow rates, according to an embodiment of the present invention.
Figure 2B:
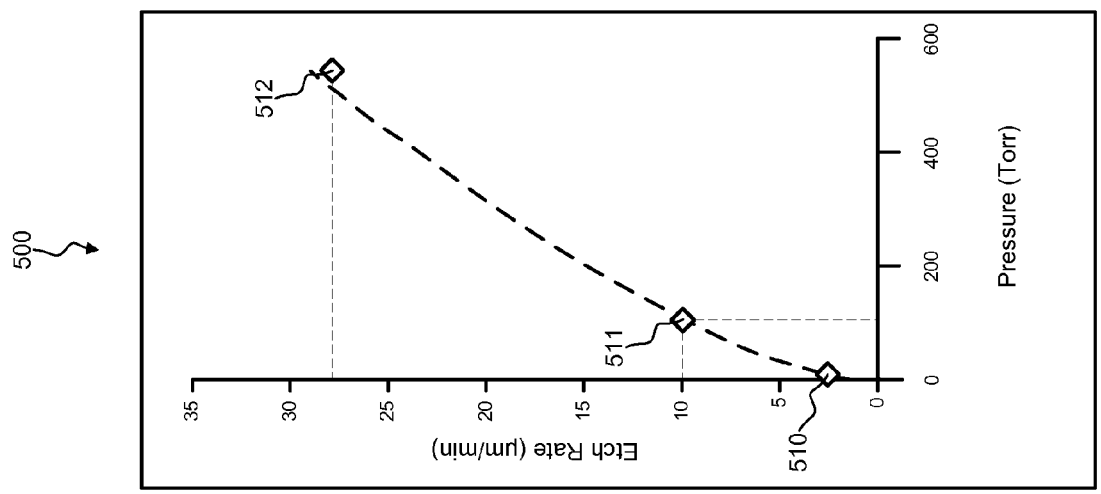
FIG. 2B is a graph depicting the etch rate at various pressures, according to an embodiment of the present invention.
Figure 2A:
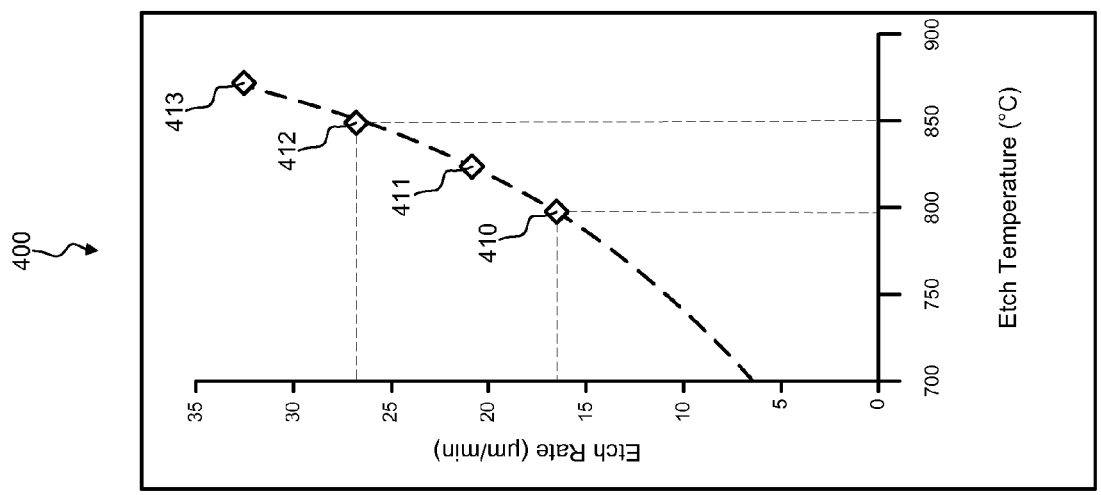
FIG. 2A is a graph depicting the etch rate at various temperatures, according to an embodiment of the present invention.

FIGS. 2A-2C are a series of graphs depicting how the etch rate of the etching process described above in conjunction with FIG. 1 changes in response to a change of various process parameters. As can be seen in FIGS. 2A-2C, there may be an exponential relationship between etch rate and etch temperature, and a power-law relationship between etch rate and etch pressure, and etch rate and HCl flow rate. It should be noted that the graphs of FIGS. 2A-2C are approximate and the etch rates may differ from those depicted in the graphs based on a number of factors, including those discussed above. Embodiments of the invention are not limited to only the etching regimes presented in the graphs.

Referring to FIG. 2A, a graph 400 depicts a plurality of etching regimes 410-413 where the temperature is changed while maintaining a constant pressure (550 torr) and constant etchant flow rate (HCL: 10 slm, $GeH_4$: 300 sccm). As can be seen in the graph 400, by increasing the temperature in the process chamber from approximately 800° C. to approximately 850° C., for example, the etch rate may be increased from approximately 16 μm/min to approximately 27 μm/min.

Referring to FIG. 2B, a graph 500 depicts a plurality of etching regimes 510-512 where the pressure is changed while maintaining a constant temperature (850° C.) and constant etchant flow rate (HCL: 10 slm, GeH$_4$: 300 sccm). As can be seen in the graph 500, by increasing the pressure in the process chamber from approximately 100 torr to approximately 550 torr, for example, the etch rate may be increased from approximately 10 μm/min to approximately 28 μm/min.

Referring to FIG. 2C, a graph 600 depicts a plurality of etching regimes 610-613 where the HCl flow rate is changed while maintaining a constant temperature (850° C.) and pressure (550 T). As can be seen in the graph 600, by increasing the HCl flow rate from approximately 10 sccm to approximately 50 torr, for example, the etch rate may be increased from less than 5 μm/min to approximately 20 μm/min. Increasing the HCl flow rate again to approximately 200 μm/min further increase the etch rate, though by a lesser amount, to approximately 24 μm/min.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of etching a silicon semiconductor substrate, the method comprising:
   heating the silicon semiconductor substrate in a process chamber to at least approximately 700° C.; and
   flowing hydrochloric acid and a germanium-carrying compound into the process chamber, wherein the hydrochloric acid flow rate is at least approximately 100 sccm and the germanium-carrying compound flow rate is at least approximately 50 sccm.

2. The method of claim 1, wherein the germanium-carrying compound is selected from the group consisting of germane, germanium tetrachloride, and digermane.

3. The method of claim 1, wherein the process chamber is a rapid thermal chemical vapor deposition chamber.

4. The method of claim 1, wherein the masking layer is formed on a <1,0,0> surface of the silicon substrate.

5. The method of claim 1, wherein the silicon substrate is heated to between approximately 800° C. and approximately 1000° C.

6. The method of claim 1, wherein the hydrochloric acid flow rate is between approximately 10 slm and approximately 20 slm.

7. The method of claim 1, wherein the germanium-carrying compound flow rate is between approximately 100 sccm and approximately 500 sccm.

8. The method of claim 1, wherein hydrogen is flowed into the process chamber while heating the silicon substrate.

9. The method of claim 1, wherein the pressure in the process chamber while flowing hydrochloric acid and the germanium-carrying compound into the process chamber is at least approximately 10 torr.

10. The method of claim 1, wherein the pressure in the process chamber while flowing hydrochloric acid and the germanium-carrying compound into the process chamber is between approximately 100 torr and approximately 700 torr.

11. The method of claim 1, further comprising, after flowing hydrochloric acid and the germanium-carrying compound into the process chamber, flowing hydrochloric acid without the germanium-carrying compound into the process chamber.

12. The method of claim 1, wherein flowing hydrochloric acid and the germanium-carrying compound into the process chamber results in the silicon substrate being etched at a rate of at least approximately 10 μm/min.

13. The method of claim 1, further comprising, prior to heating the silicon substrate:
   forming a masking layer above the silicon substrate; and
   forming a mask opening in the masking layer.

14. The method of claim 13, wherein the masking layer comprises one or more materials selected from the group consisting of photoresists, oxides, and nitrides.

15. The method of claim 13, wherein the masking layer has a thickness of at least 1 nm.

16. The method of claim 13, wherein the masking layer has a thickness between approximately 2 nm and approximately 1 μm.

17. The method of claim 13, wherein the mask opening has a width of at least approximately 1 μm.

18. The method of claim 13, wherein flowing hydrochloric acid and germane into the process chamber results in an opening being formed in the silicon substrate below the mask opening.

19. The method of claim 18, wherein the opening extends fully through the silicon substrate.

20. The method of claim 18, wherein the opening has a depth of less than the thickness of the silicon substrate.

* * * * *